(12) United States Patent
Kim

(10) Patent No.: US 7,001,842 B2
(45) Date of Patent: Feb. 21, 2006

(54) METHODS OF FABRICATING SEMICONDUCTOR DEVICES HAVING SALICIDE

(75) Inventor: Yeong Sil Kim, Suwon (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 11/010,764

(22) Filed: Dec. 13, 2004

(65) Prior Publication Data
US 2005/0191835 A1 Sep. 1, 2005

(30) Foreign Application Priority Data
Dec. 12, 2003 (KR) .................. 10-2003-0090577

(51) Int. Cl.
*H01L 21/31* (2006.01)
(52) U.S. Cl. .................. 438/660; 438/595; 438/683; 438/685; 438/686; 438/745; 438/778
(58) Field of Classification Search ............... 438/530, 438/595, 626, 631, 645, 649, 655, 660, 664, 438/682, 696, 706, 715, 721, 745, 755, 760, 438/FOR 182, FOR 360, 674, 680, 683, 438/685, 686, 703, 778, FOR 388, FOR 395
See application file for complete search history.

(56) References Cited

U.S. PATENT DOCUMENTS

| | | | |
|---|---|---|---|
| 5,851,890 A * | 12/1998 | Tsai et al. .................. | 438/303 |
| 6,380,057 B1 * | 4/2002 | Buynoski et al. ........... | 438/592 |
| 6,461,951 B1 * | 10/2002 | Besser et al. ............... | 438/592 |
| 6,548,403 B1 * | 4/2003 | Ngo et al. .................. | 438/682 |
| 6,602,754 B1 * | 8/2003 | Kluth et al. ................. | 438/303 |
| 6,743,689 B1 * | 6/2004 | Paton et al. ................. | 438/305 |
| 6,764,912 B1 * | 7/2004 | Foster et al. ................ | 438/305 |
| 2001/0031535 A1 * | 10/2001 | Agnello et al. ............. | 438/275 |
| 2002/0013016 A1 * | 1/2002 | Lee ............................ | 438/109 |
| 2003/0049918 A1 * | 3/2003 | Shen et al. .................. | 438/586 |
| 2003/0141551 A1 * | 7/2003 | Hokazono et al. .......... | 257/368 |
| 2003/0205774 A1 * | 11/2003 | Hokazono .................... | 257/486 |
| 2004/0132274 A1 * | 7/2004 | Jun et al. ..................... | 438/592 |
| 2005/0014367 A1 * | 1/2005 | Kim ............................ | 438/682 |

\* cited by examiner

*Primary Examiner*—George Fourson
*Assistant Examiner*—Joannie Adelle Garcia
(74) *Attorney, Agent, or Firm*—Hanley, Flight & Zimmerman, LLC

(57) ABSTRACT

Methods for fabricating a semiconductor device with salicide are disclosed. One example method includes forming a gate electrode structure having a gate oxide film, a gate electrode, and a protection film stacked on a substrate in succession, and gate spacers on sidewalls of the stack of the gate oxide film, the gate electrode, and the protection film; forming an insulating film on an entire surface of the substrate, the insulating film exposing upper portions of the gate electrode and the gate spacers; and removing portions of the protection film and the gate spacers, to expose an upper portion of the gate electrode. The example method may also include applying a salicide forming metal on an entire surface of the substrate; and performing a heat treatment process to form salicide on the gate electrode and the gate spacers, selectively.

19 Claims, 5 Drawing Sheets

METHODS OF FABRICATING SEMICONDUCTOR DEVICES HAVING SALICIDE

TECHNICAL FIELD

The present disclosure relates to semiconductor fabrication and, more particularly, to methods of fabricating a semiconductor devices having salicide.

BACKGROUND

In general, there are cases when a salicide region is formed selectively for meeting a signal speed of a semiconductor device product. Particularly, there are semiconductor devices that require salicide, not on an active region, but only on a gate of a transistor.

FIGS. 1A and 1B illustrate sections for explaining occurrence of over etch at a non-salicide region (active region), and a salicide region when an oxide film is etched selectively for fabricating a semiconductor device with salicide according to a related art method.

Referring to FIG. 1A, in a related art method for fabricating a semiconductor device, a shallow trench isolation (STI) film 204 is formed on a substrate 202, and deposition and etching are repeated selectively, to form a gate oxide film 206, a gate electrode 208, and spacers 210 are formed on predetermined positions of the substrate 202, respectively. In this instance, though not shown on the drawing, ions are injected after formation of the gate electrode 208, to form source/drain electrodes in the substrate in predetermined regions thereof.

Next, an oxide film 212 of a thickness is deposited on an entire surface of the substrate 202, a photomask process (PR coating, exposure, and development) is performed, to form an etch mask 214 having a pattern defining a salicide region thereon. In FIG. 1A, reference symbol A1 denotes a non-salicide region (active region), and reference symbol A2 denotes a salicide region.

Then, as shown in FIG. 1B, wet etching is performed with a solution containing HF or the like, to remove, for an example, the oxide film 212 on the salicide region A2 selectively, and expose the salicide region A2, to form a non-salicide region of an oxide film.

However, the related art method, in which the non-salicide region is formed by the wet etching with a solution containing HF after defining a salicide region with an etch mask, i.e., wet etching having isotropic etching characteristics, causes fast etching at an interface of films, to cause, for an example, as shown at a reference symbol B1 in FIG. 1B, over-etching up to the active region (i.e., the etching encroaches into the active region to form salicide), and, as shown at a reference symbol B2 in FIG. 1B, lateral etching even at the gate electrode, all of which result in poor electric characteristics of the semiconductor device at the end, to drop productivity and reliability of the product.

DETAILED DESCRIPTION

Different from the foregoing related art method in which salicide is defined on a gate electrode by defining a salicide region with an etch mask, and by defining a non-salicide region by wet etching having an isotropic etching characteristic with a solution containing HF, disclosed herein are methods forming an insulating film on a substrate having a gate formed thereon, planarizing the insulating film by CMP or the like, to remove the insulating film, and expose an upper portion of the gate electrode selectively, and coating a salicide forming material, to form salicide on the gate electrode, selectively. The salicide can drop contact resistance, sheet resistance, and so on, to improve a signal speed of a product.

Figure 1A:
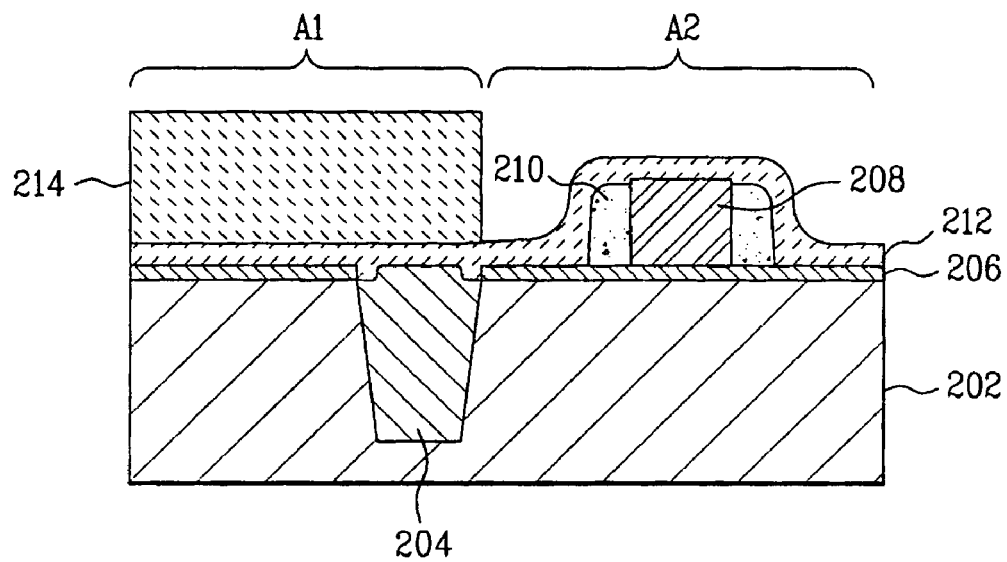
FIGS. 1A and 1B illustrate sections for explaining occurrence of over etch at a non-salicide region (active region), and a salicide region when an oxide film is etched selectively for fabricating a semiconductor device with salicide according to a related art method.
Figure 1B:
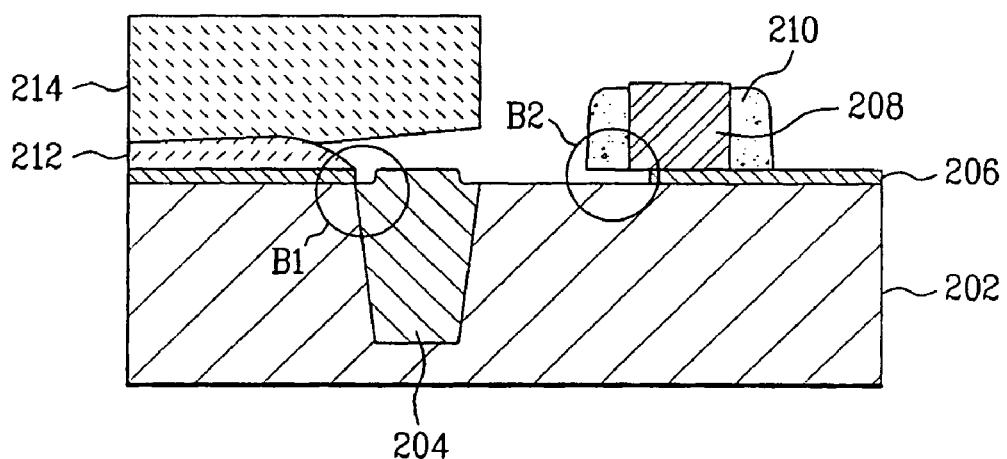
Figure 2A:
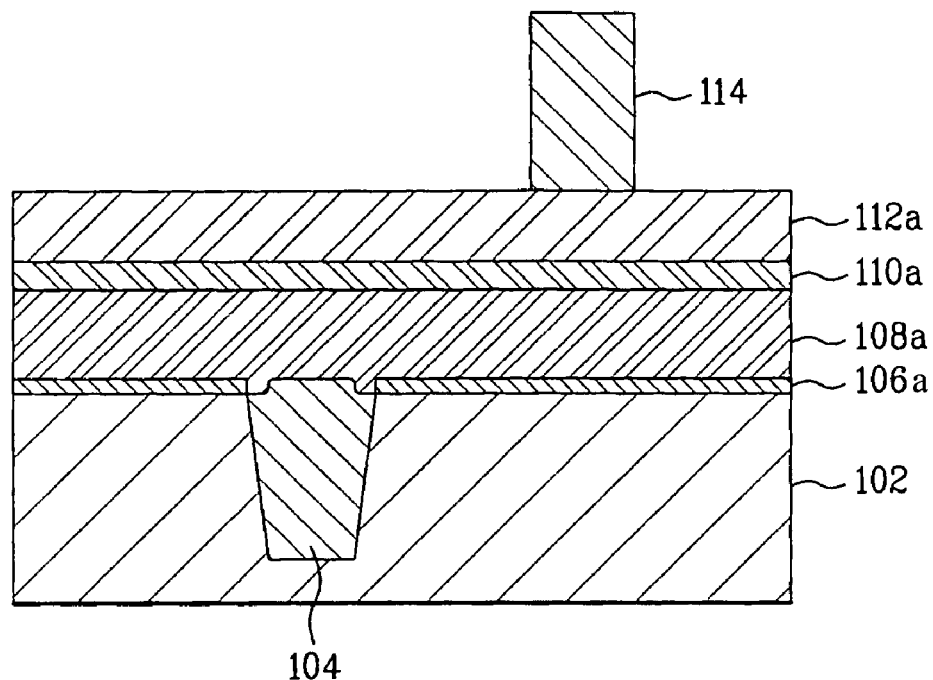
FIGS. 2A–2H illustrate sections showing the steps of a method for fabricating a semiconductor device with salicide as disclosed herein.

Referring to FIG. 2A, an STI film 104 is formed on a substrate 102 by trench etching, deposition, and etching, and so on. A gate oxide 106a, gate polysilicon 108a, buffer oxide 110a, and nitride 112a are stacked in succession on an entire surface of the substrate 102. Then, photoresist material is applied on the nitride 112a, and subjected to exposure and development to leave the photoresist material only on a portion a gate electrode is to be formed thereon selectively, to form an etch mask 114.

Taking technologies presently used in the field into account, in one example the gate polysilicon 108a has a thickness in a range of approximately 1800 Å to about 2600 Å and the buffer oxide 110a has a thickness in a range of about 150 Å to 300 Å. The buffer oxide 110a moderates damage to the gate oxide 106a, and the gate polysilicon 108a caused by stress. Though the buffer oxide 110a may be formed by, for an example, CVD, PE-CVD, or so on, in one particular example the buffer oxide 110a is formed by CVD for minimizing damage to the gate oxide 106a caused by charge-up or impurities. The nitride 112a may be formed by CVD under the same reason of the case of the buffer oxide 110a, and, in general, the nitride 112a has a thickness in a range of approximately 1000 Å to 1500 Å.

That is, though, in general, after either gate polysilicon, or a metal (tungsten, or the like) is deposited, and a nitride is deposited for a mask, a photo process (a photoresist film coating, development, exposure, and so on) is performed, the nitride 112a is deposited, not right after the gate polysilicon 108a is deposited, but the buffer oxide 110a is deposited at first, which can moderate stress of the nitride 112a. Subsequently, the nitride 112a is deposited thereon.

Then, an etching step using the etch mask 114 as an etch stop layer, for an example, a dry etching by using plasma, is performed, to etch the nitride 112a, the buffer oxide 110a, and the gate polysilicon 108a in succession, to expose an upper portion of the gate oxide 106a, to form a gate oxide film 106, a gate electrode 108, a buffer oxide film 110, and a nitride film 112 stacked on the substrate 102 in succession. Though not shown in the drawing in detail, after forming a multi-layered gate electrode structure, source/drain electrodes are formed in required regions in the substrate 102 by various ion injection processes, and so on.

Figure 2B:
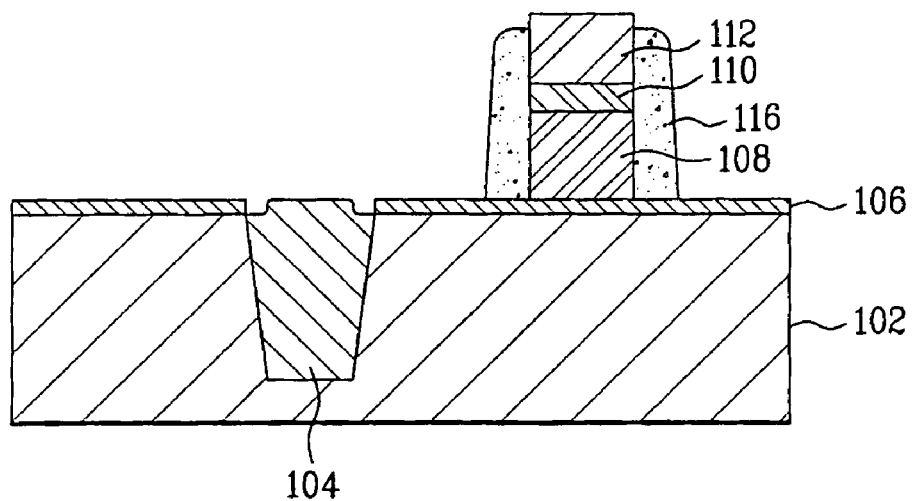

Then, referring to FIG. 2B, nitride for gate spacers is deposited on an entire surface of the substrate 102, and subjected to dry etching by plasma, to form gate spacers 116 on sidewalls of the gate electrode structure. In this instance, though the spacer nitride has a thickness in a range of about 700 Å to 1500 Å, the thickness of deposition can be varied according to device characteristics and a circuit system. The buffer oxide film 110 and the nitride film 112 serve as a protection film for the gate electrode structure.

Figure 2C:
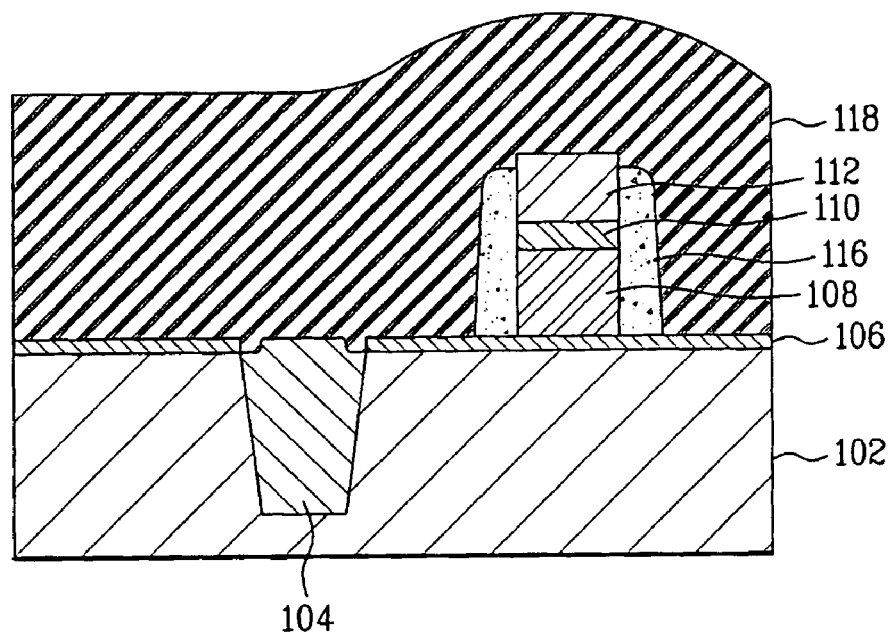

Next, referring to FIG. 2C, after depositing a thick insulating film 118 on an entire surface of the substrate 102 enough to bury the gate electrode structure fully by a deposition process, a CMP process is performed to planarize the insulating film 118.

Figure 2D:
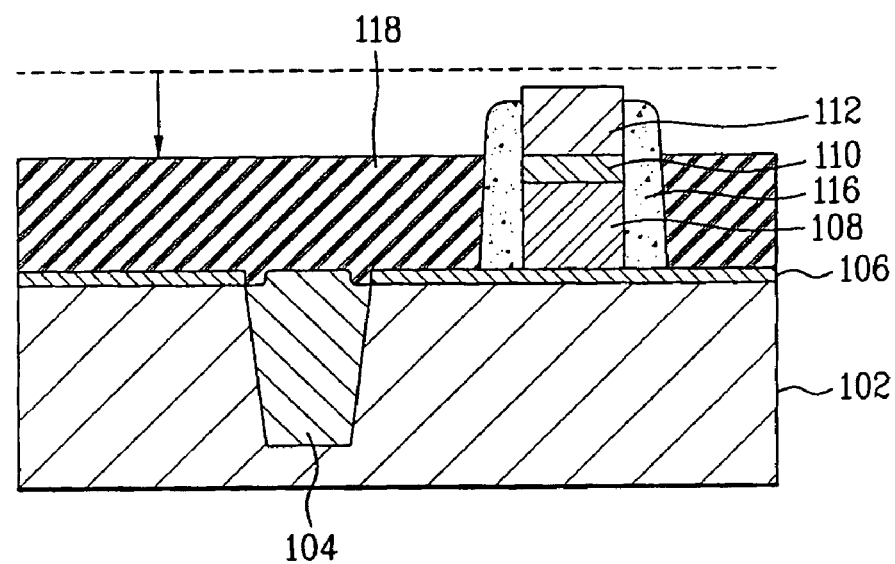

In more detail, for an example, as shown in a dotted line (a CMP stop line) in FIG. 2D, after planarizing the insulating film 118 by CMP, a portion of the insulating film 118 is removed by using wet etching using a chemical that can etch the insulating film 118 selectively, or by using dry etching taking the nitride film 112 in the gate electrode structure as an end point (etch stop point) (i.e., dry etching by using plasma), to expose an upper portion of the nitride film 112 and a portion of an upper portion of the gate spacers 116.

Figure 2E:
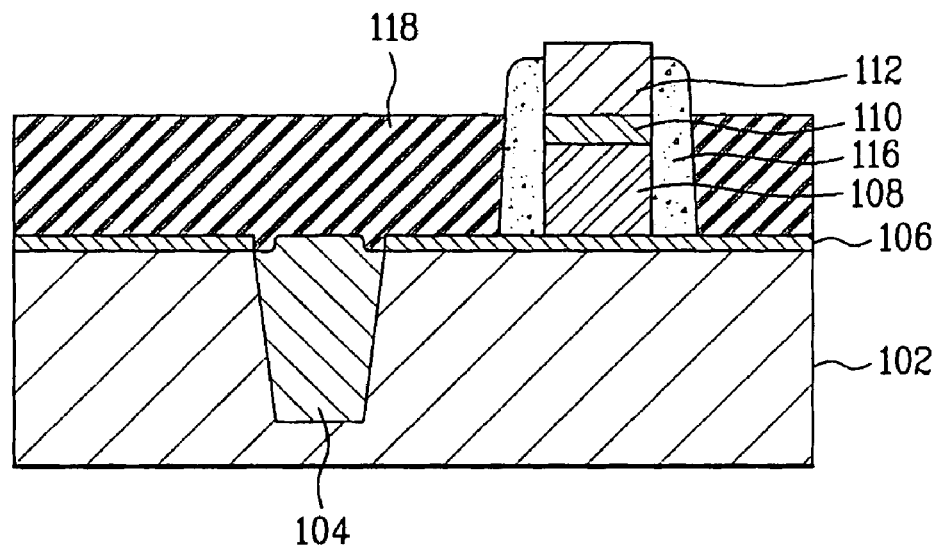

In this instance, different from the related art in which the upper portion of the nitride film of the gate electrode structure is exposed by CMP, and wet, or dry etching, for an example, as shown in FIG. 2E, it is also possible that, by performing a global CMP taking the nitride film 112 of the gate electrode structure as an end point (etch stop point), an upper portion of the nitride film 112, and a portion of the upper portion of the gate spacers 116 can be exposed.

Figure 2F:
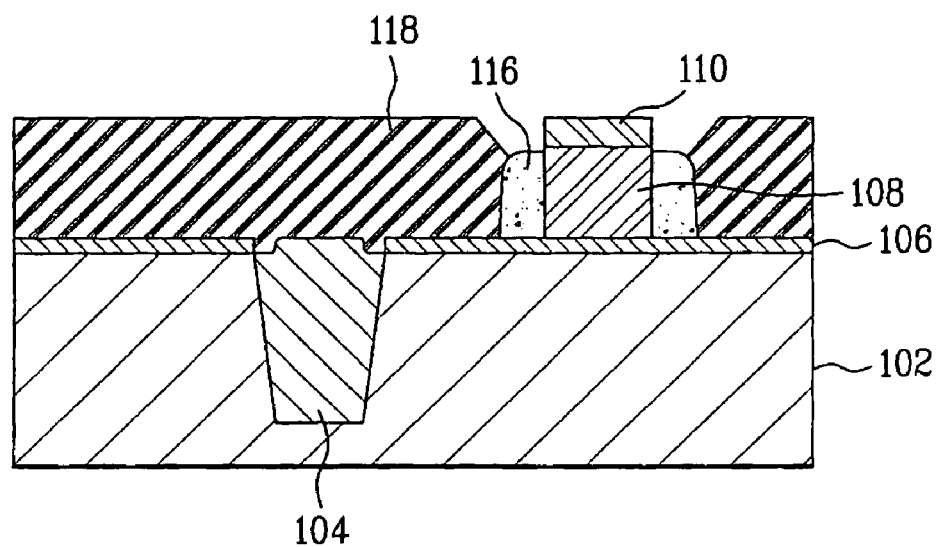

Then, for an example, as shown in FIG. 2F, by performing wet or dry etching process, the nitride film 112 of the gate electrode structure used for planarizing the insulating film 118, and a portion of the nitride film of the gate spacer 116 are removed, until the gate electrode structure and the gate spacers 116 have thicknesses similar to the insulating film 118. For example, a wet etching by using a chemical may be used in this process, because the gate oxide can be protected from all possible damages once the gate electrode structure is finished. Different from this, a chemical dry etch (CDE) may be used, which gives no damage.

In the case of wet etching, a chemical containing hot phosphoric acid is used, and in the case of CDE, a combination of an F-group gas, such as $CF_4$, $SF_6$, $NF_3$, and the like, and an additive gas of $O_2$, $N_2$, Ar, He, or so on provides a selectivity of nitride to oxide to a few tenths to one, the CDE is very favorable in controlling a thickness of the insulating film.

Then, by using a chemical containing HF, or by CDE dry etching by using above gases, the buffer oxide, i.e., the buffer oxide film 110 on the gate electrode 108 is removed. According to this, only an upper portion of the gate electrode 108, and upper portions of the gate spacers 116 are exposed, while all other portions are covered with the insulating film 118 having the same or similar height with the gate electrode 108.

Figure 2G:
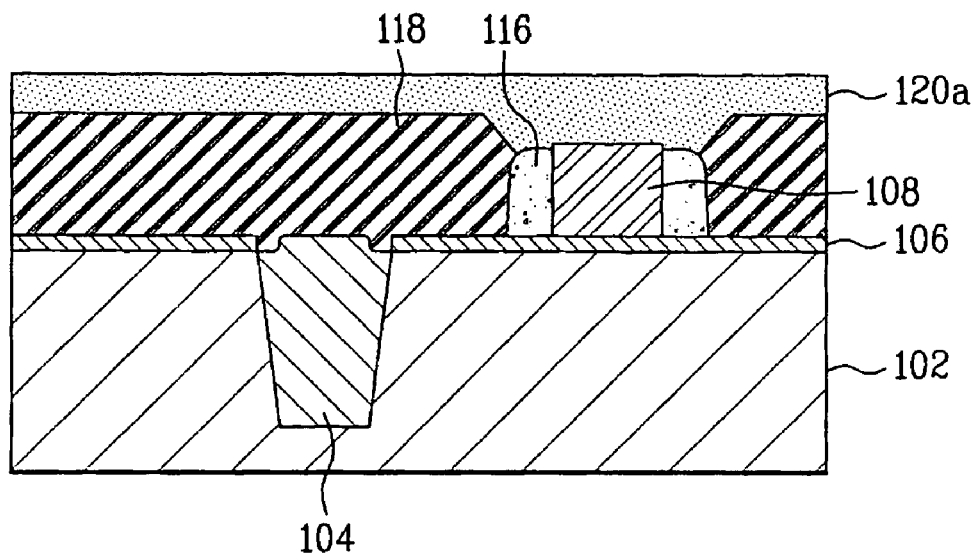
Figure 2H:
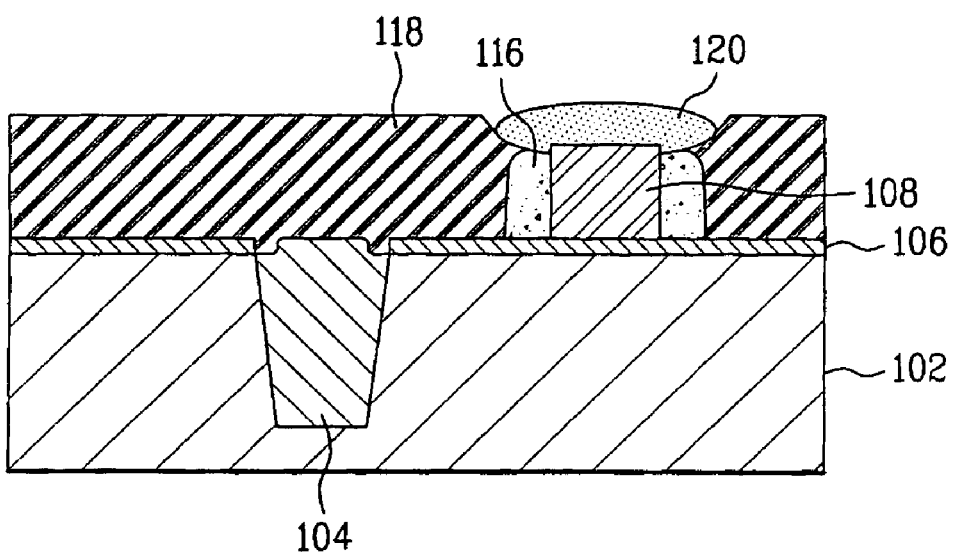

Next, for an example, as shown in FIG. 2G, a deposition process is performed, to deposit a salicide forming metal 120a on an entire surface of the substrate 102. In the salicide forming metal 120a, there are Ti, TiN, Co, Ni, Pt, W, and so on. Thus, because a variety of metals can be used as the salicide forming metal, the disclosed fabrication process has extensive application.

Then, as shown in FIG. 2G, a heat treatment is performed under a predetermined process condition, to cause a reaction between an underlying film and the metal 120a, to convert the metal 120a both on the gate electrode 108 and the gate spacers 116, and then the metal 120a is removed from a region excluding portion converted into salicide, to form salicide 120 only on the gate electrode 108 and the gate spacers 116.

Different from the related art method in which salicide is defined on a gate electrode by defining a salicide region with an etch mask, and by defining a non-salicide region by wet etching having an isotropic etching characteristic with a solution containing HF, by forming an insulating film on a substrate having a gate formed thereon, planarizing the insulating film by CMP or the like, to remove the insulating film, and expose an upper portion of the gate electrode selectively, and coating a salicide forming material, to form salicide on the gate electrode selectively, over-etch up to the active region, or, lateral etching at the gate electrode can be prevented effectively, thereby enhancing productivity and reliability of the product.

Disclosed herein are methods for fabricating semiconductor devices with salicide. In particular, the disclosed methods form the salicide at a target region with a high precision. In addition, the salicide can prevent damage to an active region and a gate oxide caused by formation of the salicide from occurring.

One example disclosed method for fabricating a semiconductor device with salicide, includes forming a gate electrode structure having a gate oxide film, a gate electrode, and a protection film stacked on a substrate in succession, and gate spacers on sidewalls of the stack of the gate oxide film, the gate electrode, and the protection film, forming an insulating film on an entire surface of the substrate, the insulating film exposing upper portions of the gate electrode and the gate spacers, and removing portions of the protection film and the gate spacers, to expose an upper portion of the gate electrode. The example method may also include applying a salicide forming metal on an entire surface of the substrate, and performing a heat treatment process to form salicide on the gate electrode and the gate spacers, selectively.

This application claims the benefit of Korean Application No. P2003-0090577 filed on Dec. 12, 2003, which is hereby incorporated by reference as if fully set forth herein.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device with salicide, comprising:

forming a gate electrode structure having a gate oxide film, a gate electrode, and a protection film stacked on a substrate in succession, and gate spacers on sidewalls of the stack of the gate oxide film, the gate electrode, and the protection film;

forming an insulating film on an entire surface of the substrate, the insulating film exposing upper portions of the gate electrode and the gate spacers;

removing portions of the protection film and the gate spacers, to expose an upper portion of the gate electrode;

applying a salicide forming metal on an entire surface of the substrate; and performing a heat treatment process to form salicide on the gate electrode and the gate spacers, selectively.

2. A method as defined in claim 1, wherein forming the gate electrode structure includes;

stacking gate oxide, gate polysilicon, buffer oxide, and nitride on the substrate in succession, performing selective etching with an etch mask, to remove portions of the nitride, the buffer oxide, and the gate polysilicon in succession, to expose a portion of an upper portion of the gate oxide selectively, and forming the gate spacers on the sidewalls of the stack of the gate oxide film, the gate electrode, and the protection film, to form the gate electrode structure having the stack of the gate oxide, the gate electrode, and the protection film with the buffer oxide, and the nitride.

3. A method as defined by claim 2, wherein the buffer oxide has a thickness ranging from about 150 Å to 300 Å.

4. A method as defined by claim 3, wherein the buffer oxide is deposited by CVD, or PE-CVD.

5. A method as defined by claim 1, wherein forming the insulating film includes;
   applying insulating material on an entire surface of the substrate in a form the insulating material buries the gate electrode structure,
   planarizing an upper portion of the insulating material,
   removing a portion of an upper portion of the insulating material, to expose an upper portion of the protection film, and
   removing upper portions of the protection film and the gate spacers, for forming the insulating film which exposes upper portions of the gate electrode and the gate spacers.

6. A method as defined by claim 5, wherein the planarizing is made by CMP.

7. A method as defined by claim 5, wherein the portion of the upper portion of the insulating material is planarized by wet, or dry etching.

8. A method as defined by claim 5, wherein the protection film includes a stack of a buffer oxide film and a nitride film.

9. A method as defined by claim 8, wherein the portions of upper portions of the nitride film and the gate spacers are etched by wet etching with a chemical, or dry etching.

10. A method as defined by claim 9, wherein the chemical includes hot phosphoric acid.

11. A method as defined by claim 9, wherein the dry etching is performed by using a combination of an F-group gas, such as $CF_4$, $SF_6$, or $NF_3$, and an additive gas of $O_2$, $N_2$, Ar, or He.

12. A method as defined by claim 8, wherein the buffer oxide film is removed by wet etching with a chemical containing HF, or dry etching.

13. A method as defined by claim 1, wherein forming the insulating film includes;
   applying insulating material on an entire surface of the substrate in a form the insulating material buries the gate electrode structure,
   performing full surface etching taking the protection film as an etch stop point, to expose upper portions of the protection film and the gate spacers, and
   removing a portion of each of upper portions of the protection film and the gate spacers, for forming the insulating film which exposes upper portions of the gate electrode and the gate spacers.

14. A method as defined by claim 13, wherein the protection film includes a stack of a buffer oxide film and a nitride film.

15. A method as defined by claim 14, wherein portions of upper portions of the nitride film and the gate spacers are etched by wet etching with a chemical, or dry etching.

16. A method as defined by claim 15, wherein the chemical includes hot phosphoric acid.

17. A method as defined by claim 15, wherein the dry etching is performed by using a combination of an F-group gas, such as $CF_4$, $SF_6$, or $NF_3$, and an additive gas of $O_2$, $N_2$, Ar, or He.

18. A method as defined by claim 14, wherein the buffer oxide film is removed by wet etching with a chemical containing HF, or dry etching.

19. A method as defined by claim 1, wherein the salicide forming metal is one selected from Ti, TiN, Co, Ni, Pt, and W.

* * * * *